United States Patent
Bell

(10) Patent No.: US 10,429,423 B2
(45) Date of Patent: Oct. 1, 2019

(54) PASSIVE INTERMODULATION (PIM) PROBE

(71) Applicant: Thomas Edward Bell, Larkspur, CO (US)

(72) Inventor: Thomas Edward Bell, Larkspur, CO (US)

(73) Assignee: PIM Solutions LLC, Larkspur, CO (US)

( * ) Notice: Subject to any disclaimer, the term of this patent is extended or adjusted under 35 U.S.C. 154(b) by 175 days.

(21) Appl. No.: 15/698,606

(22) Filed: Sep. 7, 2017

(65) Prior Publication Data

US 2018/0088161 A1 Mar. 29, 2018

Related U.S. Application Data

(60) Provisional application No. 62/400,117, filed on Sep. 27, 2016.

(51) Int. Cl.
*G01R 29/08* (2006.01)
*H01Q 7/00* (2006.01)
(Continued)

(52) U.S. Cl.
CPC ......... *G01R 29/0814* (2013.01); *H01Q 1/242* (2013.01); *H01Q 1/38* (2013.01);
(Continued)

(58) Field of Classification Search
CPC .......... H01Q 21/29; H01Q 7/00; H01Q 1/242; H01Q 1/38; G01R 29/0814; G01R 29/08
(Continued)

(56) References Cited

U.S. PATENT DOCUMENTS

| 2009/0243756 A1* | 10/2009 | Stevenson | A61N 1/3754 333/172 |
| 2011/0004276 A1* | 1/2011 | Blair | A61B 5/0002 607/60 |

(Continued)

OTHER PUBLICATIONS

Tom Short, Fault Location on Distribution Systems: An Update on EPRI and DOE Research, IEEE Distribution Subcommittee presentation, Orlando, FL Jan. 19, 2007.

(Continued)

*Primary Examiner* — Hai V Tran
(74) *Attorney, Agent, or Firm* — Mehrman Law Office; Michael J. Mehrman

(57) ABSTRACT

A PIM probe that includes a PIM antenna carried on a wand sized for positioning by hand. The PIM antenna is tuned by loop size to receive PIM corresponding to uplink reception channels of a site antenna generated by downlink broadcast frequencies F1 and F2 of the duplex antenna. The PIM antenna vanes may include conductors printed on a PC boards or wire loops. A PIM probe system includes a signal analyzer that displays a representation of PIM received by the PIM antenna. The PIM probe system further includes an RF filter for passing the PIM frequencies of interest and suppressing the test frequencies transmitted by the site antenna, such as a cellular base station antenna. When the site antenna is broadcasting the test frequencies, the technician places the PIM antenna in various locations to detect the presence of PIM in those locations.

20 Claims, 6 Drawing Sheets

(51) Int. Cl.
    *H01Q 1/38*     (2006.01)
    *H01Q 1/24*     (2006.01)
    *H01Q 21/29*     (2006.01)
    *H01Q 5/30*     (2015.01)
    *H01Q 1/42*     (2006.01)

(52) U.S. Cl.
    CPC ............... *H01Q 7/00* (2013.01); *H01Q 21/29* (2013.01); *H01Q 1/42* (2013.01); *H01Q 5/30* (2015.01)

(58) Field of Classification Search
    USPC ........................................................ 343/866
    See application file for complete search history.

(56) References Cited

U.S. PATENT DOCUMENTS

| | | | | |
|---|---|---|---|---|
| 2011/0260941 | A1* | 10/2011 | Jones | H01Q 9/0435 343/776 |
| 2013/0310023 | A1* | 11/2013 | Bevan | H04B 1/1027 455/423 |
| 2014/0049267 | A1 | 2/2014 | Cordaro | |
| 2015/0042536 | A1* | 2/2015 | Emerick | H01Q 9/40 343/843 |
| 2015/0350940 | A1 | 12/2015 | Wilson et al. | |
| 2016/0028497 | A1 | 1/2016 | Holt et al. | |
| 2016/0157115 | A1 | 6/2016 | Kim et al. | |
| 2018/0152253 | A1* | 5/2018 | Bell | C09J 7/38 |

OTHER PUBLICATIONS

Sayed Khundmir T, Fault Locating Using Voltage and Current Measurements, The Best Group, The Buffalo Energy Science ans Technology Group, Winter Lecture Series, Winter 2013.

Karl Zimmerman and David Costello, Impedance-Based Fault Location Experience, SEL Journal of Reliable Power, No. 1, Jul. 2010.

* cited by examiner

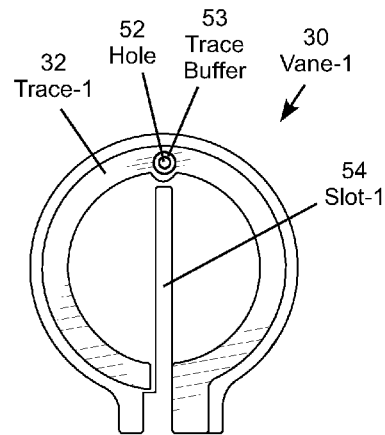
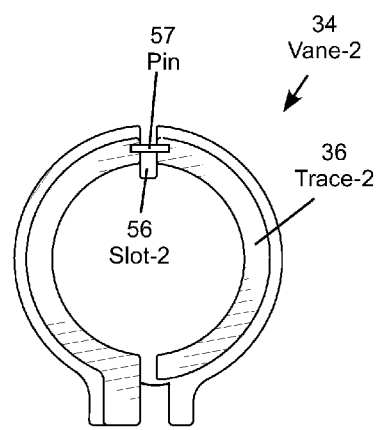
FIG. 5A  FIG. 5B
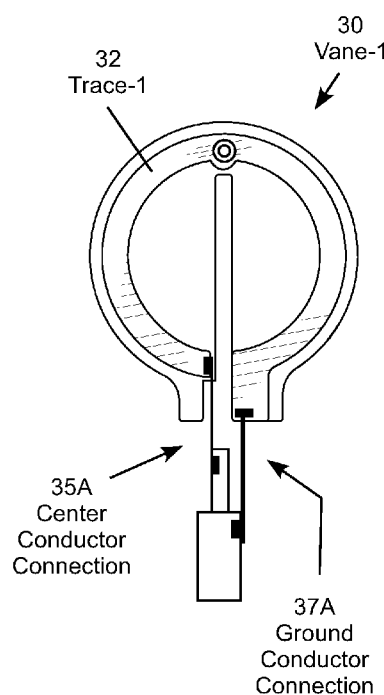
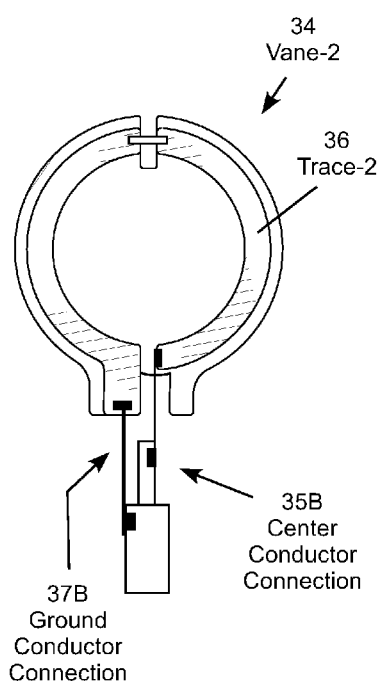
FIG. 6A  FIG. 6B

PASSIVE INTERMODULATION (PIM) PROBE

REFERENCE TO RELATED APPLICATION

This application claims priority to commonly owned U.S. Provisional Application Ser. No. 62/400,117 entitled "PIM Probe" filed on Sep. 27, 2016, which is incorporated by reference.

TECHNICAL FIELD

The present invention is directed to cellular communication systems and, more particularly, to a passive intermodulation (PIM) probe used to detect PIM interference produced by objects illuminated by broadcast antennas, such cellular telephone base station antennas.

BACKGROUND

Passive intermodulation known as "PIM" is a fairly well known type of electromagnetic interference in cellular systems. Downlink signals at the cell site mix at passive, non-linear junctions in the radio frequency (RF) path, creating new signals. If these new signals (intermodulation products) fall in an operator's uplink band, they can elevate the noise floor and degrade system performance. Mobile operators require testing at multiple steps in the process to detect and mitigate PIM. Individual components are tested by manufacturers before leaving the factory using factory PIM test equipment in accordance with standard IEC 62037 promulgated by the International Electrotechnical Commission (IEC) to verify that the individual components are low PIM.

In conventional PIM testing procedures, two test signals (F1, F2) corresponding to cellular telephone downlink bands are generated by a PIM analyzer, combined and transmitted to the device under test. PIM produced by the device under test propagates in all directions. PIM returning to the PIM analyzer passes through a series of filters and a low noise amplifier before arriving at the test instrument receiver.

Special care must be taken when PIM testing through antennas to make sure that the environment around the antenna is "PIM-free." PIM generated by sources beyond the site antenna will radiate back into the site antenna and will be detected by the PIM analyzer receiver. Even antennas with very good PIM performance based on its own PIM production will fail the PIM test when measured in an environment with external PIM sources.

After a cellular installation is completed, a system level PIM test is conducted using field PIM test equipment. This test verifies that the entire RF path is low PIM, including the antenna feed system as well as the environment around the antenna. Failures due to PIM sources inside the antenna feed system are relatively easy to locate. Software features are available from PIM test equipment manufacturers to identify how far the offending PIM source(s) are located from the test analyzer. This information combined with the knowledge that PIM usually occurs at RF connections enables technicians to quickly locate internal PIM sources and make repairs.

If the PIM source is beyond the antenna itself, however, identifying the location of the PIM source becomes significantly more difficult. Distance-to-PIM estimates may provide an indication of how far the PIM source is from the antenna, but does not provide any guidance on the direction. The method most commonly used to locate external PIM problems has been a "trial and error" method using RF absorbing foam. The process involves measuring system PIM while methodically covering metal objects in front of or near the back of the antenna with RF absorbing foam until the technician either gets lucky and finds all the problems, or runs out of RF absorber. This method is very time consuming and ultimately may not be successful if the offending PIM source is not somewhere obvious.

There is, therefore, a need for a more effective approach for PIM detection and mitigation.

SUMMARY

The present invention may be embodied in a PIM probe that includes a PIM antenna carried on a wand sized for positioning by hand. The PIM antenna is tuned by loop size to receive PIM frequencies of interest generated by downlink broadcast frequencies of a site antenna. A coaxial cable is electrically connected to and extends from the PIM antenna. A filter connected to the coaxial cable is configured to suppress the downlink broadcast frequencies and pass the PIM frequencies of interest. A signal analyzer connected to the coaxial cable is configured to display a representation of PIM received by the PIM antenna.

In a first embodiment, the PIM antenna includes two orthogonal PC board printed conductor vanes. In another embodiment, the PIM antenna includes two orthogonal wire loops. The PIM probe may also include a handle at the opposite end of the wand from the PIM antenna. The filter may be positioned inside the handle, inside the wand, or in-line with the coaxial cable between the wand and the signal analyzer. The coaxial cable may extend through the wand, through the handle, and terminate at a cable connector on the handle. The probe may also include a protective cover over the PIM antenna.

It will be understood that specific embodiments may include a variety of features in different combinations, as desired by different users. In view of the foregoing, it will be appreciated that the present invention provides a cost effective PIM probe. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which:

FIG. 5A is a front view of a first vane of the PC board type antenna.

FIG. 5B is a front view of a second vane of the PC board type antenna.

FIG. 6A is a front view of the vane of the PC board type antenna showing conceptual connections to a coaxial cable.

FIG. 6B is a front view of the second vane of the PC board type antenna showing conceptual connections to a coaxial cable.

DETAILED DESCRIPTION

Figure 1:
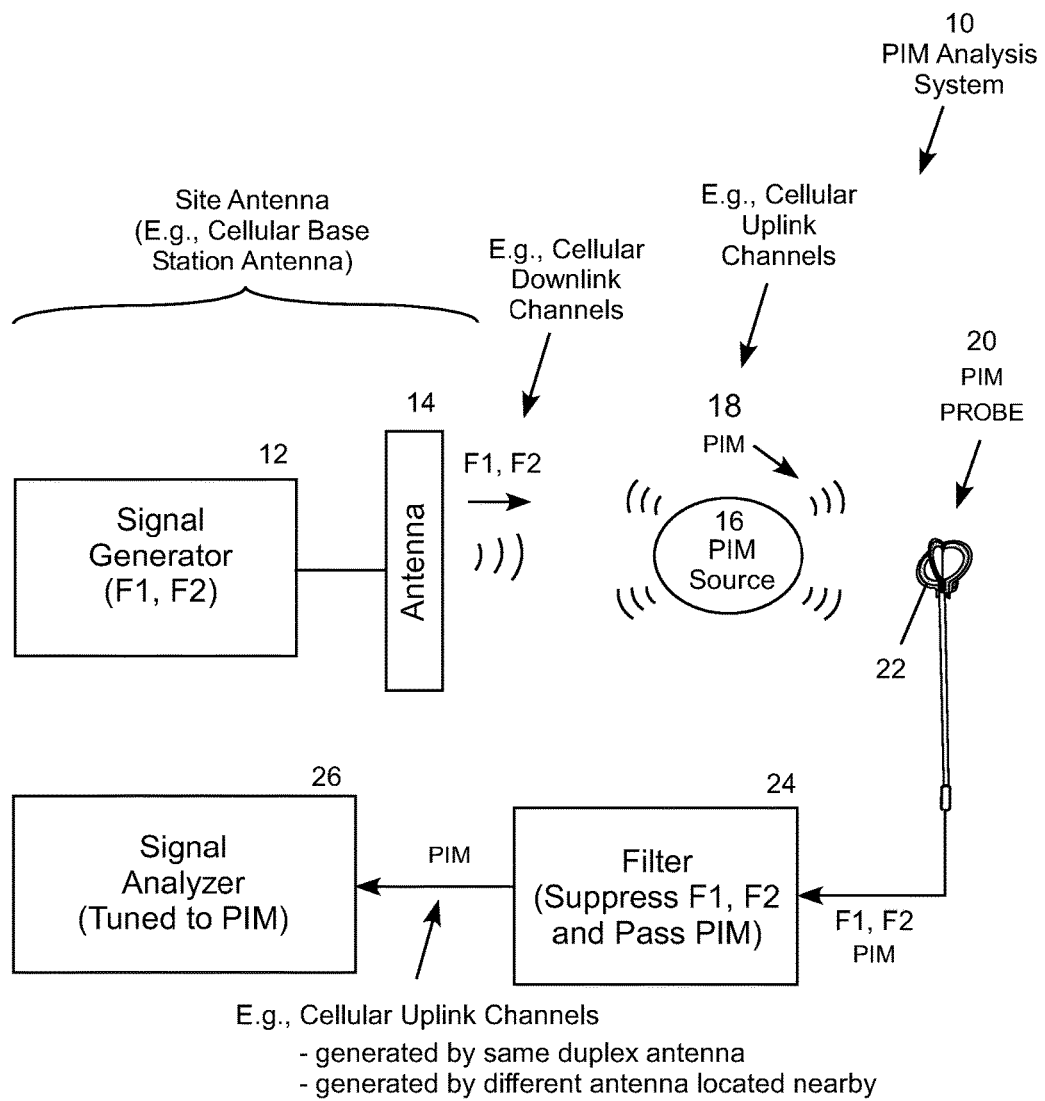
FIG. 1 is conceptual illustration of a PIM analysis system.

The embodiments of the invention include a PIM probe that includes a PIM antenna carried on a wand sized for positioning by hand by a technician. The PIM antenna is tuned by loop size to receive PIM frequencies of interest associated with broadcast frequencies. For example, the broadcast frequencies may correspond to downlink channels of a duplex cellular base stations antenna, and the PIM frequencies of interest may correspond to uplink channels of that duplex antenna. As another example, the broadcast frequencies may correspond to downlink channels of a first cellular base station antenna, and the PIM frequencies of interest may correspond to uplink channels of a second cellular base stations antenna located (or to be located) near the first cellular base station antenna. As a specific example, the downlink channel of a 600 MHz cellular base station antenna might generate IM3 that falls in the uplink band of a different 1900 MHz cellular base station antenna located nearby.

The PIM antenna may include a pair of orthogonal antenna vanes. In a first alternative, the PIM antenna vanes include conductors printed on PC boards. In a second alternative, the PIM antenna vanes include wire loops surrounded by a cover. A PIM probe system includes a PIM probe, a signal analyzer, and a coaxial cable for connecting the PIM probe to the signal analyzer, which displays a representation of PIM received by the PIM probe. The PIM probe system further includes an RF filter for suppressing the test frequencies transmitted by the site antenna and passing the PIM frequencies of interest. When the site antenna is broadcasting the test frequencies, the technician places the antenna of the PIM probe in various locations to detect the presence of PIM in those locations.

The PIM probe should be relatively insensitive to orientation of the probe antenna. When probing for a PIM source it is desirable that the PIM magnitude not vary significantly due to probe antenna orientation with respect to the PIM source. This is especially important when testing very close to the PIM source location. When far away (e.g., greater than 10 dB in magnitude away from the peak being searched for) more probe orientation variation is tolerable. Although a single loop has been found to be overly sensitive to loop orientation, a multi-loop design exhibits acceptable orientation insensitivity. While any number of loops may be utilized, two orthogonal loops have been found be an acceptable balance between cost and performance. In general, two orthogonal antenna loops may be used to capture components of the radiated magnetic field regardless of probe antenna orientation. With this design, an experimental PIM probe achieved less than 4 dB variation in signal level versus probe orientation, as compared to greater than 20 dB variation with the single loop design. The loops may be printed onto "FR4" PC board material using traditional single sided printed circuit board technology. Slots are cut in the boards for alignment. An electrically isolated hole is provided in one loop allowing a pin to pass through and complete the opposite loop.

Although the PIM probe described below with reference to the appended figures is designed for use to detect PIM created by high power cellular base station antenna broadcasts, alternative embodiments may be used for other applications and power levels. For example, the PIM probe can also be used to detect external PIM in low power systems such as in-building, distributed antenna systems. In these systems, the power level radiated from the antenna is only +20 dBm.

FIG. 1 is conceptual illustration of a PIM analysis system 10. The PIM probe system represents an improved technique for precisely locating external PIM sources at an antenna broadcast site, such as a cellular telephone base station. In the example shown in FIG. 1, the site antenna 14 is fed by a signal generator 12 producing high power test signals at frequencies F1 and F2. In particular, the test signals frequencies F1 and F2 and broadcast power level may correspond to the downlink channels used by a cellular telephone base station. The antenna 14 broadcasts the frequencies F1 and F2, which illuminate a PIM source 16. The PIM source creates harmonics and combines the incident energy creating PIM 18. For example, the PIM source 16 may generate harmonics of the test frequencies F1 and F2, which may individually or in combination create PIM 18 corresponding to one or more uplink channels of the antenna 14. In particular, the test frequencies F1 and F2 may correspond to the downlink channels of a cellular base station antenna, while the PIM 18 frequencies or interest correspond to the uplink channels of that same cellular base station antenna.

The improved PIM detection technique involves using a near field PIM probe 20 with a PIM antenna 22 connected to a signal analyzer 26 to "interference hunt" for PIM sources beyond the antenna. An illustrative test configuration is shown in FIG. 1 (see also FIG. 10). In this system, two high power test signals (F1 and F2) are transmitted into the environment around the site antenna 14. In addition to an operational base station antenna, a number of transmitters may be used to evaluate a prospective base station site prior to installing the antenna. For example, a Remote Radio Head (RRH) at the site could be programmed to generate the two test signals or a traditional PIM analyzer could be used to generate the test signals. A third option would be to develop a "transmit only" test device that is able to generate two test signals over a wide range of frequencies, with no provision for receiving the PIM signals produced. A fourth option utilizes a probe to detect broadband PIM. For example, a technician may not want to carry a PIM analyzer to the top of the tower to act as a signal source, and the RRH manufacturer may have not created software to generate two specific test tones. In this case, the technician may tune the PIM signal analyzer to a broad frequency range and use the cellular carrier frequency generated by the RRH as the signal source. The probe will detect broadband PIM frequencies in the same way. Rather than hunting for a single frequency (generated by specific F1 and F2), the technicians hunt for broadband noise rise corresponding to multiple F1 and F2 combinations generated by the individual cellular carrier resource block frequencies.

The two test signals (F1 and F2) radiating from the antenna 14 mix at the PIM source 16 beyond the antenna and generate PIM 18 including intermodulation product frequencies (IM2, IM3, IM4, IM5, etc.) including various combinations of harmonics of F1 and F2. The PIM source 16 radiates these IM product frequencies (PIM 18) in all directions, enabling them to be detected using the PIM probe 20 connected to a remote receiver, such as the signal analyzer 26 by way of a filter 24 that suppresses the broadcast test signals (F1 and F2) and passes the PIM frequencies of interest. For example, the filter may suppress the downlink channels of a duplex cellular base station antenna, and pass the uplink channels of that antenna.

The receiver in this example is a signal analyzer 26 tuned to a known PIM product frequency created by the test frequencies (F1 and F2). The frequency span used is typically 100 kHz when narrow bandwidth CW signals are used for F1 and F2, as is the case when a PIM analyzer is used as the signal generator. A band-pass filter 24 may be attached to the signal analyzer to pass the PIM frequencies of interest and block the broadcast test signals (F1, F2) from entering the signal analyzer 26. A minimum of 30 dB rejection (attenuation) of the high power test signals (F1, F2) is typically sufficient. If the test signals (F1, F2) are able to enter the signal analyzer 26, they will generate active intermodulation products within the signal analyzer receiver, which can produce false readings. A low PIM test cable, such as a coaxial cable, connects the filter and signal analyzer to the PIM probe.

The PIM probe 20 should itself exhibit low PIM. If the PIM probe 20 generates PIM at a level close to the value the technician is trying to detect when exposing the probe to the high power test tones, everything beyond the antenna will falsely appear to be generating PIM. To combat this, the PIM probe 20 should be constructed with low PIM materials and all metal-to-metal connections should be soldered or designed to maintain high contact pressure.

The PIM probe 20 is relatively small making it easy for a human technician to physically handle with one hand, allowing the technician to position the probe close to potential PIM sources while standing out of the line of site from the antenna to the PIM source. From the free space loss Equation No. 1 it is known that the signal emitting from a source drops 32.44 dB within the first wavelength.

$$\text{loss} = 32.44 + 20(\log F) + 20(\log D), \text{ where } F = \text{frequency in MHz}, D = \text{distance in km} \quad \text{Equation No. 1}$$

The PIM probe 20 can be used to take advantage of this fact by testing for significant PIM signal level increases when the PIM antenna 22 is positioned less than one wavelength from the PIM source. Inside this region, the PIM is directly coupling energy from the PIM source to the probe, experiencing significantly less path loss than when testing occurs more than one wavelength from the PIM source. At typical cellular telephone frequencies, this means that the PIM probe 20 works well when the PIM antenna 22 is placed within one wavelength (e.g., 6 to 18 inches at typical 1900 MHZ and 600 MHZ cellular frequencies, respectively) of the PIM source 16. The hand-held wand configuration assists the technician in placing the PIM antenna 22 close to structures to be tested, while standing out of the line of site between the antenna 14 and the structures being tested to the avoid blocking the RF beams radiated by the antenna 14.

Figure 2:
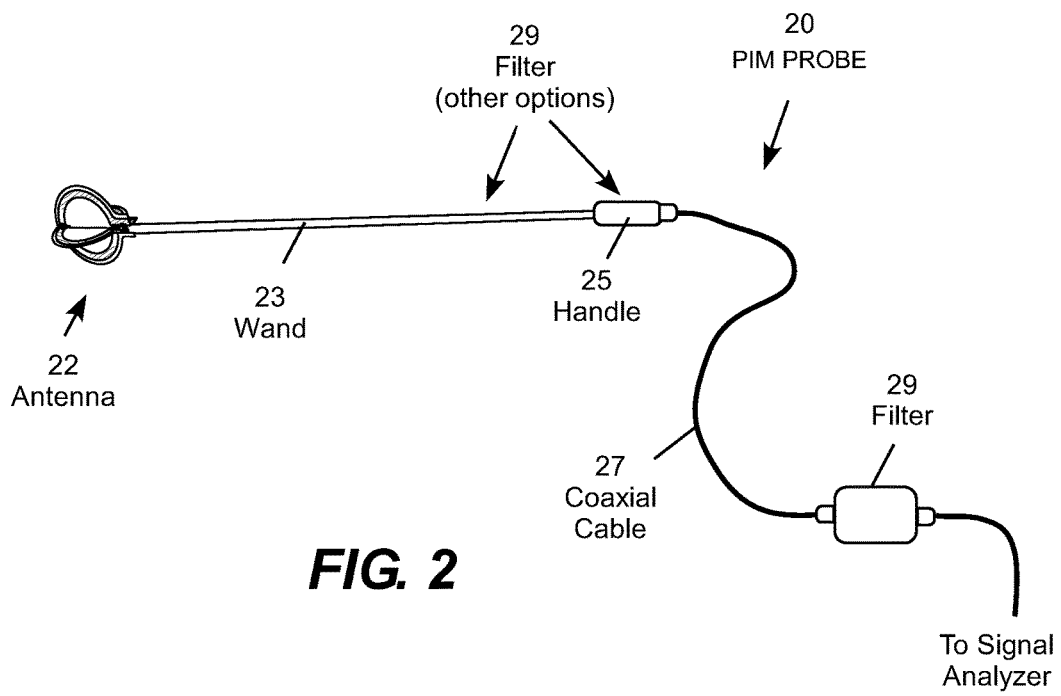
FIG. 2 is a perspective plan view of a PIM probe with a PC board type of antenna.

FIG. 2 is a perspective plan view of a PIM probe 20, which includes a PIM antenna 22 attached to one end of a wand 23 with a handle 25 attached to the other end of the wand. A coaxial cable 27 extends from the PIM antenna 22, through the hollow wand 23 and handle 25, and out of the handle 25. As an option, an internal cable may terminate at the handle, where a cable connecter is provided for connecting an auxiliary cable 27 to the probe. The auxiliary cable 27, in turn, connects to a filter 29 selected to pass the PIM frequencies of interest and suppress the test signals F1, F2 transmitted by the site antenna 14. For example, the filter may suppress the downlink channels of a duplex cellular base station antenna, and pass the uplink channels of that antenna. Different filters may be selected to match different test frequencies and PIM frequencies of interest. As an option, the filter may be built into the wand of the PIM probe, in which case different probes may be selected to match different test frequencies. As another option, the filter may be built into a removable handle 25 of the PIM probe, in which case different handles may be selected and installed on the wand to match different test frequencies.

Figure 3:
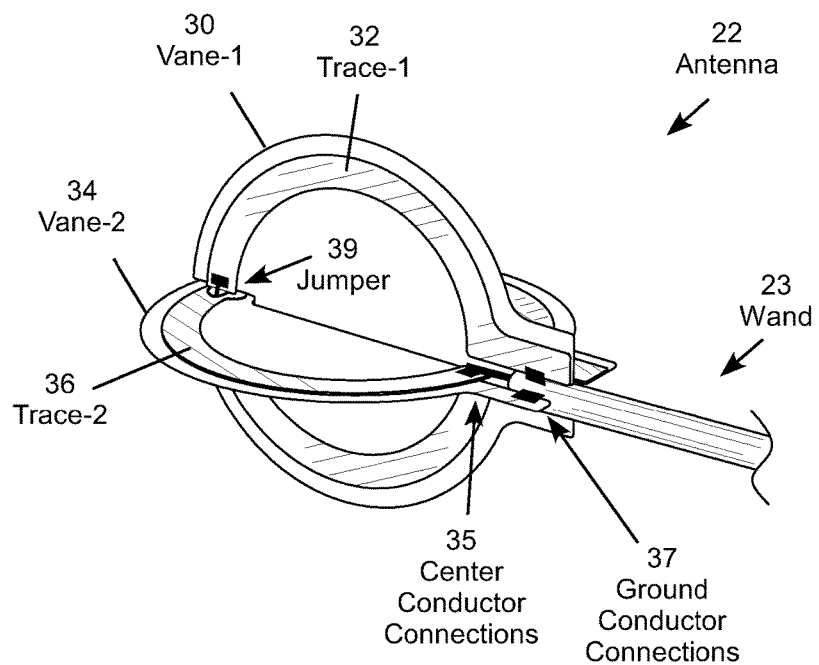
FIG. 3 is a perspective plan view of the PC board type of PIM probe antenna.

FIG. 3 is a perspective plan view of the PIM antenna 22, which has a PC board printed conductor configuration including conductor rings printed on two orthogonal PC boards. More specifically, the PIM antenna 22 includes a first PC board forming vane-1 30 carrying a ring shaped printed conductor trace-1 32. A second PC board forming second vane-2 34, positioned orthogonal to vane-1, carries a second ring shaped printed conductor trace-2 36. The PC board vanes interlock without electrically connecting the traces. A first end of each trace attaches to the center conductor of the coaxial cable, while the other end attaches to the mesh ground shield conductor of the coaxial cable. In a particular embodiment, the PIM antenna 22 is a magnetic field antenna largely circular in shape having an outside diameter of 1.25 inch and an inside diameter of 1.0 inch. One end of the loop is soldered to the center conductor of the feeding coaxial cable and the other end is soldered to the ground shield of the cable. The PIM antenna is tuned by loop size to receive the PIM frequencies of interest, typically corresponding to the uplink channels of the site antenna. In a particular example, the circumference of the inner and outer diameters may be close to being resonant (multiples of ¼ wavelength) of the uplink frequencies of the commercial wireless bands in the 700 MHz to 2600 MHz range. Antennas with different loop sizes may be tuned by loop size selection at multiples of ¼ wavelength of specific PIM frequencies of interest.

Figure 4:
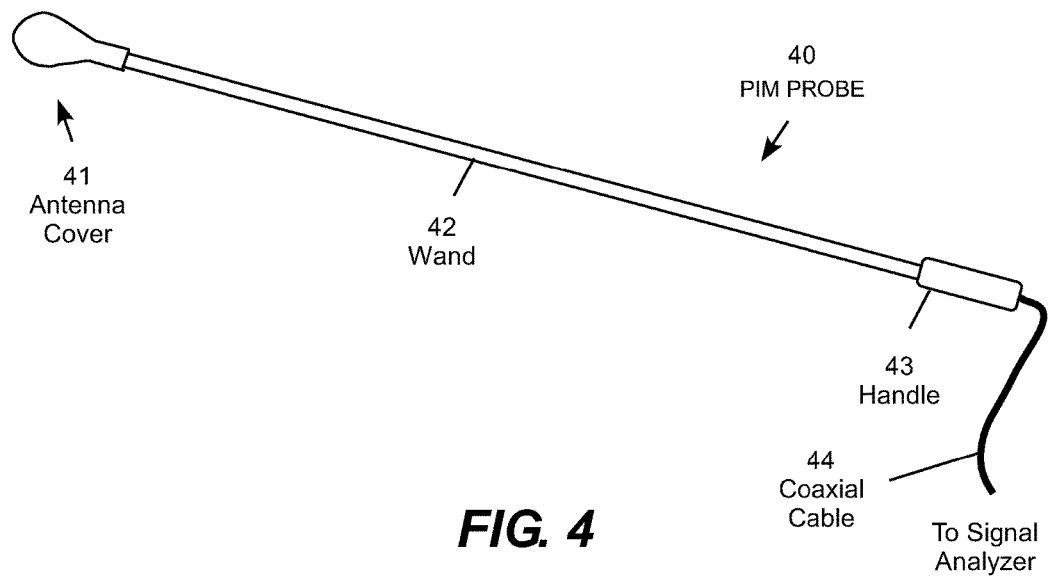
FIG. 4 is a perspective plan view of a PIM probe with a protective cover over the PIM antenna.

FIG. 4 is a perspective view of an illustrative PIM probe 40 shown approximately to scale. The PIM antenna is under an antenna cover 41 formed of material impervious to RF radiation, such as rubber or plastic. A wand 42 approximately three feet long extends from the antenna cover 41 to the handle 43. A coaxial cable 44 extends from the handle. The PIM antenna under the cover 41 may be soldered directly to an internal coaxial cable to minimize PIM creation at the connection. Alternatively, if desired, a removable antenna with cover in place may thread or fit into a connector on the end of the wand 42 allowing for the PIM antenna to be removed and replaced as desired. A coaxial cable connector at the end of the handle 43 may also be soldered directly to the internal coaxial cable to minimize PIM creation at the connection. As an option, however, a filter may be disposed in the handle 43, which may thread or fit into a connector on the end of the wand 42 allowing for the PIM antenna to be removed and replaced as desired.

FIG. 5A is a front view of vane-1 30 of the PC board type of PIM probe antenna 22. Vane-1 30 carries a first ring trace-1 32 that is open at the bottom forming an open rather than a closed ring. A hole 52 surrounded by a trace buffer 53 at the apex of the trace-1 32 and a slot 54 slot are provided for receiving the other vane-2 34 (shown in FIG. 5B). When the vanes are positioned in the orthogonal position, a conductive pin 57 (shown in FIG. 5B) extends through the hole 52 where it bridges the trace-2 36 on vane-2 34 without electrically connecting to trace-1 32 on vane-1 30. The trace buffer 53 is an area of the PC board not covered by the trace-1 32 allowing the pin 57 to pass through the hole 52 without electrically contacting the trace-1. As an option, a wire with an insulator cover could be utilized instead of the trace buffer 53 to allow the conductive bridge to pass through the hole 52 without electrically contacting the trace-1.

FIG. 5B is a front view of vane-2 34 of the PC board type of PIM probe antenna 22. Vane-2 34 carries a second ring trace-2 36 that is open at the bottom forming an open rather than a closed ring. A slot 56 at the apex of the trace-2 36 is provided for receiving the other vane-1 30 (shown in FIG. 5A). When the vanes are positioned in the orthogonal position, the pin 57 extends through the hole 52 in the vane-1 30 where it bridges the slot 56 on vane-2 34 to provide electrical continuity of the trace-2 36 across the slot 56 without electrically connecting to trace-1 32 on the other vane-1 30. As noted above, the trace buffer 53 allows the pin 57 to pass through the hole 52 and bridge the trace-2 36 across the slot 56 without electrically contacting the trace-1 32 on vane-1 30 (shown in FIG. 5A).

FIG. 6A shows that the center conductor of the coaxial cable forms a first center conductor connection 35A with one end of trace-1 32, while the coaxial cable ground conductor forms a first ground conductor connection 37A with the other end of trace-1 32 on vane-1 30. Similarly, FIG. 6B shows that the center conductor of the coaxial cable forms a second center conductor connection 35B with one end of trace-2 36, while the coaxial cable ground conductor forms a second ground conductor connection 37B with the other end of trace-2 36 on vane-2 34.

Figure 7:
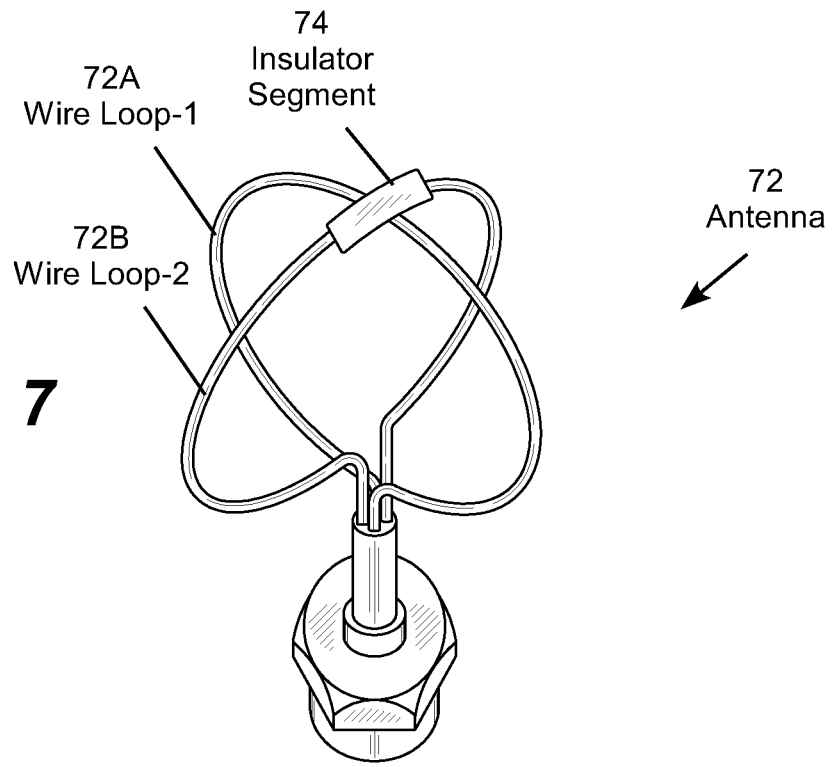
FIG. 7 is a perspective view of a wire loop type of PIM probe antenna.
Figure 8:
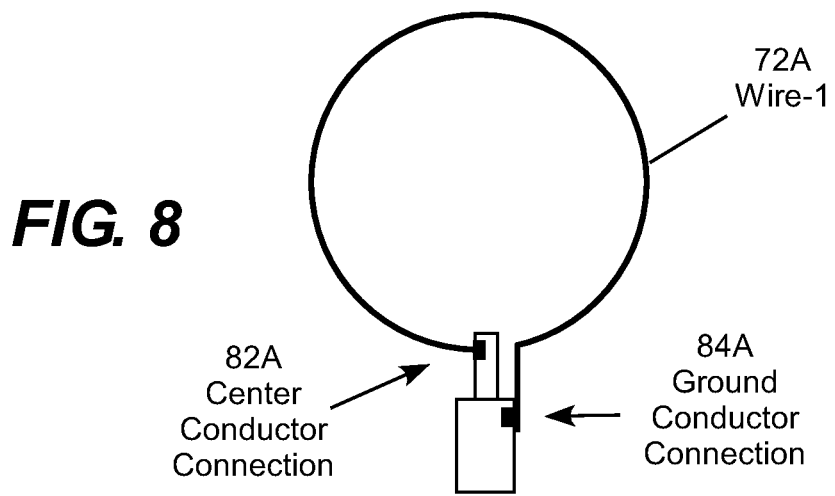
FIG. 8 is front view of a wire loop of the PIM probe antenna showing conceptual connections to a coaxial cable.

FIG. 7 is a perspective plan view of a wire loop type of PIM probe 72. This probe is similar to the PIM probe 20, except that the PC board vanes are replaced by wire loop-1 72A and wire loop-2 72B typically located inside a protective cover. A section of electric insulator 74 prevents the wire loops from electrically contacting each other. FIG. 8 shown for wire loop-1 72A, which is essentially the same for both wire loops, shows that the coaxial cable makes a center loop connection 82A with one end of the wire loop-1 72A, and a ground conductor connection 84A with the other end of the loop. The outside diameter of each wire loop may be approximately 1.25 inch. While the material cost of the wire loops is very low, they are difficult to assemble by hand. The alternative PC board type of antenna utilizes more expensive printed circuit loops to greatly simplify assembly.

Figure 9:
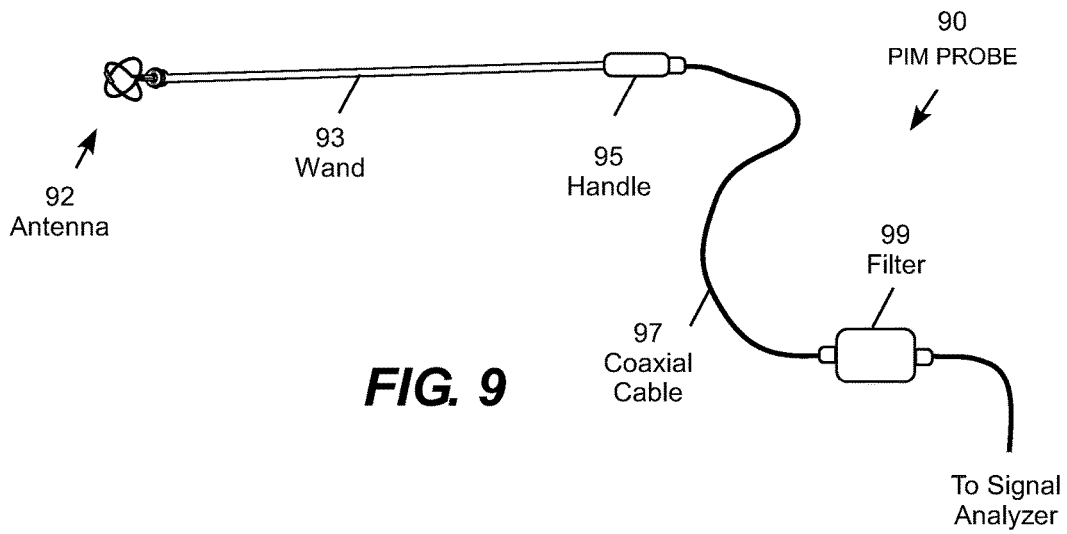
FIG. 9 is a conceptual illustration of wire loop type of PIM probe.

FIG. 9 is a conceptual illustration of wire loop type of PIM probe 90, which includes a PIM antenna 92 attached to one end of a wand 93 with a handle 95 attached to the other end of the wand. A coaxial cable 97 extends from the PIM antenna 92, through the hollow wand 93 and handle 95, and out of the handle 95. As an option, an internal cable may terminate at the handle, where a cable connecter is provided for connecting an auxiliary cable 97 to the probe. The auxiliary cable 97, in turn, connects to a filter 99 selected to suppress the test frequencies F1, F2 transmitted by the site antenna and passes the PIM frequencies of interest. Different filters may be selected to match different test frequencies and different PIM frequencies of interest. As an option, the filter may be built into the PIM probe 90, in which case different probes having different loop diameters may be selected to match different test frequencies and PIM frequencies of interest. As another option, the filter may be built into a removable handle 95 of the PIM probe, in which case different handles may be selected and installed on the wand to match different test frequencies.

Figure 10:
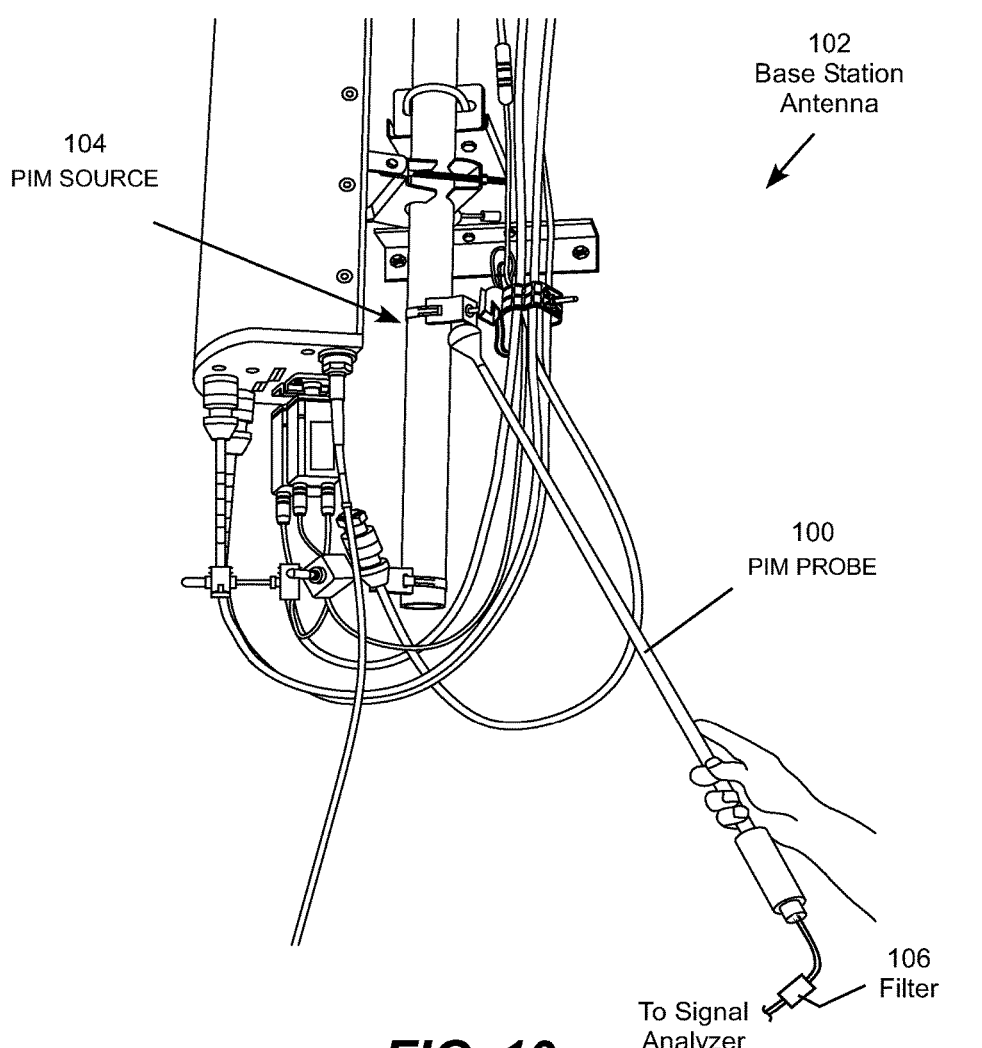
FIG. 10 is a conceptual illustration of a PIM probe in use.

FIG. 10 is a conceptual illustration of a PIM probe 100 shown approximately to scale used to measure PIM at the site of a cellular base station antenna 102. The PIM antenna end of the probe may be positioned by hand very close to a suspected PIM source 104. For example, the PIM antenna end of the probe may be positioned within one wavelength of the PIM frequencies of interest, such as the uplink frequencies of the antenna 102, typically one wavelength (e.g., 6 to 18 inches at typical 1900 MHZ and 600 MHZ cellular frequencies, respectively). The size and shape of the PIM probe 100 allows the technician to position the PIM antenna end of the probe with one hand while standing out of the line of site from the antenna 102 to the PIM antenna of the probe 100. A filter 106 in line from the probe to a signal analyzer suppresses the downlink broadcast frequencies of the antenna 102 and passes the PIM frequencies of interest.

In this particular example, the length of the probe is 35 inches from tip of input connector to top of the protective cover of the probe. This minimum length is advantageous to keep the technician's body out of the line between the site antenna and the PIM source. The human body has typically 10 dB RF isolation. If the technician's body comes between the site antenna and the PIM source, the magnitude of PIM produced by the source will reduce by as much as 40 dB.

The probe should have a rugged design. In a particular embodiment, the handle may be a rubberized grip on one end of the wand. The antenna cover may be an injection molded plastic or rubberized housing (also known as a radome) protecting the PIM antenna. For example, an injection molded cover may be manufactured from high impact strength ABS plastic to protect the inner printed PC board or wire loop antenna. The wand may be a filament wound fiberglass tube connecting the grip to the cover. The RF connector on the grip end may be manufactured from stainless steel for maximum mate/de-mate life.

In view of the foregoing, it will be appreciated that present invention provides significant improvements in PIM detection. The foregoing relates only to the exemplary embodiments of the present invention, and that numerous changes may be made therein without departing from the spirit and scope of the invention as defined by the following claims.

The invention claimed is:

1. A passive intermodulation (PIM) test system, comprising:
    a PIM antenna tuned by loop size to receive one or more PIM frequencies of interest generated by one or more broadcast frequencies of a site antenna;
    a wand supporting the PIM antenna on one end configured for positioning the PIM antenna by hand;
    a coaxial cable electrically connected to and extending from the PIM antenna;
    a filter connected to the coaxial cable configured to suppress the broadcast frequencies and pass the PIM frequencies of interest; and
    a signal analyzer connected to the coaxial cable configured to display a representation of PIM received by the PIM antenna;
    wherein the PIM antenna comprises a near field magnetic loop antenna for locating a source of PIM interference characterized by a wavelength by placing the PIM antenna within one wavelength of the source of the PM interference.

2. A passive intermodulation (PIM) probe, comprising:
    a PIM antenna tuned by loop size to receive one or more PIM frequencies of interest associated with one or more broadcast frequencies;
    a wand supporting the PIM antenna on one end configured for positioning the PIM antenna by hand;
    a coaxial cable electrically connected to and extending from the PIM antenna;

wherein the PIM antenna comprises two orthogonal loop conductors;
wherein the PIM antenna comprises a near magnetic loop antenna for locating a source of PIM interference characterized by a wavelength by placing the PIM antenna within one wavelength of the source of the PIM interference.

3. A method for detecting one or more passive intermodulation (PIM) frequencies of interest associated with one or more broadcast frequencies, comprising:
obtaining a passive intermodulation (PIM) probe, comprising:
a PIM antenna tuned by loop size to receive the PIM frequencies of interest comprising a near field magnetic loop antenna for locating a source of PIM interference characterized by a wavelength by placing the PIM antenna within one wavelength of the source of the PIM interference,
a wand supporting the PIM antenna on one end configured for positioning the PIM antenna by hand,
a coaxial cable electrically connected to and extending from the PIM antenna;
a filter connected to the coaxial cable configured to suppress the downlink frequencies and pass the PIM frequencies of interest, and
a signal analyzer connected to the coaxial cable configured to display a representation of PIM received by the PIM antenna;
positioning the probe by hand with the PIM antenna located adjacent to a PIM source illuminated by a the broadcast antenna while standing out of a line of sight between the broadcast antenna and the PIM source; and
viewing a representation of the PIM on the signal analyzer.

4. The passive intermodulation (PIM) test system of claim 1, wherein the coaxial cable extends through the wand.

5. The passive intermodulation (PIM) test system of claim 1, further comprising a handle at the opposite end of the wand from the PIM antenna and the coaxial cable extends from the PIM antenna, through the wand, and through the handle.

6. The passive intermodulation (PIM) test system of claim 1, wherein the filter is positioned inside the handle or inside the wand.

7. The passive intermodulation (PIM) test system of claim 1, further comprising a protective cover over the PIM antenna.

8. The passive intermodulation (PIM) test system of claim 1, wherein the filter is positioned in-line with the coaxial cable between the wand and the signal analyzer.

9. The passive intermodulation (PIM) test system of claim 1, wherein the broadcast frequencies correspond to downlink frequencies of a cellular base station antenna, and the PIM frequencies of interest correspond to uplink frequencies of the cellular base station antenna.

10. The passive intermodulation (PIM) test system of claim 1, wherein the broadcast frequencies correspond to downlink frequencies of a first cellular base station antenna, and the PIM frequencies of interest correspond to uplink frequencies of a second cellular base station antenna located or to be located near the first cellular base station antenna.

11. A passive intermodulation (PIM) probe, comprising:
a PIM antenna tuned by loop size to receive one or more PIM frequencies of interest associated with one or more broadcast frequencies;
a wand supporting the PIM antenna on one end configured for positioning the PIM antenna by hand;
a coaxial cable electrically connected to and extending from the PIM antenna;
wherein the PIM antenna comprises two orthogonal loop conductors;
wherein the PIM antenna comprises a near field magnetic loop antenna configured to locate a source of PIM interference characterized by a wavelength by placing the PIM antenna within one wavelength of the source of the PIM interference.

12. The passive intermodulation (PIM) probe of claim 11, further comprising:
a filter connected to the coaxial cable configured to suppress the broadcast frequencies and pass PIM frequencies of interest; and
a signal analyzer connected to the coaxial cable configured to display a representation of PIM received by the PIM antenna.

13. The passive intermodulation (PIM) probe of claim 12, wherein the broadcast frequencies correspond to downlink frequencies of a cellular base station antenna, and the PIM frequencies of interest correspond to uplink frequencies of the cellular base station antenna.

14. The passive intermodulation (PIM) probe of claim 12, wherein the broadcast frequencies correspond to downlink frequencies of a first cellular base station antenna, and the PIM frequencies of interest correspond to uplink frequencies of a second cellular base station antenna located or to be located near the first cellular base station antenna.

15. A method for detecting one or more passive intermodulation (PIM) frequencies of interest associated with one or more broadcast frequencies, comprising:
obtaining a passive intermodulation (PIM) probe, comprising:
a PIM antenna tuned by loop size to receive the PIM frequencies of interest comprising a near field magnetic loop antenna configured to locate a source of PIM interference characterized by a wavelength by placing the PIM antenna within one wavelength of the source of the PIM interference,
a wand supporting the PIM antenna on one end configured for positioning the PIM antenna by hand,
a coaxial cable electrically connected to and extending from the PIM antenna;
a filter connected to the coaxial cable configured to suppress the downlink frequencies and pass the PIM frequencies of interest, and
a signal analyzer connected to the coaxial cable configured to display a representation of PIM received by the PIM antenna;
positioning the probe by hand with the PIM antenna located adjacent to a PIM source illuminated by a broadcast antenna while standing out of a line of sight between the broadcast antenna and the PIM source; and
viewing a representation of the PIM on the signal analyzer.

16. The method of claim 15, wherein the PIM antenna comprises two orthogonal PC board printed conductor vanes.

17. The method of claim 15, wherein the PIM antenna comprises two orthogonal two orthogonal wire loops.

18. The method of claim 15, further comprising holding the probe by a handle at the opposite end of the wand from the PIM antenna, wherein the coaxial cable extends through the wand and through the handle and terminates at a cable connector on the handle.

19. The method of claim 15, wherein the broadcast frequencies correspond to downlink frequencies of a cellular base station antenna, and the PIM frequencies of interest correspond to uplink frequencies of the cellular base station antenna.

20. The method of claim 15, wherein the broadcast frequencies correspond to downlink frequencies of a first cellular base station antenna, and the PIM frequencies of interest correspond to uplink frequencies of a second cellular base station antenna located or to be located near the first cellular base station antenna.

\* \* \* \* \*